United States Patent
Shibata et al.

(10) Patent No.: US 11,107,971 B2
(45) Date of Patent: Aug. 31, 2021

(54) LAMINATED SUBSTRATE WITH PIEZOELECTRIC THIN FILM, PIEZOELECTRIC THIN FILM ELEMENT AND METHOD FOR MANUFACTURING THIS ELEMENT

(71) Applicants: SCIOCS COMPANY LIMITED, Ibaraki (JP); SUMITOMO CHEMICAL COMPANY, LIMITED, Tokyo (JP)

(72) Inventors: Kenji Shibata, Ibaraki (JP); Kazutoshi Watanabe, Ibaraki (JP); Fumimasa Horikiri, Ibaraki (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 561 days.

(21) Appl. No.: 15/767,677

(22) PCT Filed: Oct. 11, 2016

(86) PCT No.: PCT/JP2016/080105
§ 371 (c)(1),
(2) Date: Apr. 12, 2018

(87) PCT Pub. No.: WO2017/065133
PCT Pub. Date: Apr. 20, 2017

(65) Prior Publication Data
US 2018/0301618 A1    Oct. 18, 2018

(30) Foreign Application Priority Data
Oct. 16, 2015    (JP) .............................. JP2015-204179

(51) Int. Cl.
*H01L 41/18*    (2006.01)
*B41J 2/14*    (2006.01)
(Continued)

(52) U.S. Cl.
CPC .......... *H01L 41/18* (2013.01); *B41J 2/14201* (2013.01); *C01G 33/00* (2013.01); *C23C 14/08* (2013.01);
(Continued)

(58) Field of Classification Search
CPC ...... B41J 2/14201; C01G 33/00; C23C 14/08; H03H 9/02031; H03H 9/02574;
(Continued)

(56) References Cited

U.S. PATENT DOCUMENTS 6,387,295 B1    5/2002    Saito
2002/0180843 A1*    12/2002    Irie ...................... H01L 41/098
347/70
(Continued)

FOREIGN PATENT DOCUMENTS

EP    3098868 A1    11/2016
JP    2007-184513 A    7/2007
(Continued)

OTHER PUBLICATIONS

International Search Report and Written Opinion for PCT/JP2016/080105 dated (Dec. 27, 2016).
(Continued)

*Primary Examiner* — Shawki S Ismail
*Assistant Examiner* — Monica Mata
(74) *Attorney, Agent, or Firm* — Pearne & Gordon LLP

(57) ABSTRACT

There is provided a laminated substrate with a piezoelectric thin film, comprising: a substrate; an electrode film formed on the substrate; and a piezoelectric thin film formed on the electrode film, wherein the piezoelectric thin film is made of an alkali niobium oxide represented by a composition formula of $(K_{1-x}Na_x)NbO_3$ $(0<x<1)$, having a perovskite structure, and oriented preferentially in (001) plane direction, and contains a metallic element selected from a group
(Continued)

| Cu-CONCENTRATION (at%) | TIME FROM IMMERSION TO START OF EROSION IN BHF SOLUTION (MINUTE) |
|---|---|
| 0 | 0.5~1 |
| 0.1 | 1 |
| 0.2 | WITHOUT IMMERSION (AFTER ELAPSE OF 15 MINUTES) |
| 0.25 | WITHOUT IMMERSION (AFTER ELAPSE OF 15 MINUTES) |
| 0.5 | WITHOUT IMMERSION (AFTER ELAPSE OF 60 MINUTES) |
| 0.6 | WITHOUT IMMERSION (AFTER ELAPSE OF 60 MINUTES) |
| 0.7 | WITHOUT IMMERSION (AFTER ELAPSE OF 60 MINUTES) |
| 1.0 | WITHOUT IMMERSION (AFTER ELAPSE OF 120 MINUTES) |

| Cu-CONCENTRATION (at%) | VOLTAGE UP TO FLOWING OF LEAKAGE CURRENT OF 500 µA/cm³ |
|---|---|
| 0 | 2~4 |
| 0.1 | 5~7 |
| 0.2 | 30~34 |
| 0.25 | WITHOUT LEAKAGE (AT THE TIME OF APPLYING VOLTAGE OF 50 V) |
| 0.5 | WITHOUT LEAKAGE (AT THE TIME OF APPLYING VOLTAGE OF 100 V) |
| 0.6 | WITHOUT LEAKAGE (AT THE TIME OF APPLYING VOLTAGE OF 100 V) |
| 0.7 | WITHOUT LEAKAGE (AT THE TIME OF APPLYING VOLTAGE OF 100 V) |
| 1.0 | WITHOUT LEAKAGE (AT THE TIME OF APPLYING VOLTAGE OF 100 V) | consisting of Mn and Cu at a concentration of 0.2 at % or more and 0.6 at % or less.

6 Claims, 6 Drawing Sheets

(51) Int. Cl.
| | | |
|---|---|---|
| H03H 9/02 | (2006.01) | |
| H01L 41/318 | (2013.01) | |
| C23C 14/08 | (2006.01) | |
| H01L 41/08 | (2006.01) | |
| H01L 41/187 | (2006.01) | |
| C01G 33/00 | (2006.01) | |
| H01L 41/053 | (2006.01) | |
| H01L 41/316 | (2013.01) | |

(52) U.S. Cl.
 CPC ...... *H01L 41/0805* (2013.01); *H01L 41/1873* (2013.01); *H01L 41/318* (2013.01); *H03H 9/02031* (2013.01); *H03H 9/02574* (2013.01); *H01L 41/0533* (2013.01); *H01L 41/316* (2013.01)

(58) Field of Classification Search
 CPC . H01L 41/18; H01L 41/0533; H01L 41/0805; H01L 41/316; H01L 41/318; H01L 41/1873
 USPC .......................................................... 310/311
 See application file for complete search history.

(56) References Cited

U.S. PATENT DOCUMENTS

| | | |
|---|---|---|
| 2003/0008762 A1 | 1/2003 | Takao et al. |
| 2004/0127344 A1 | 7/2004 | Sato et al. |
| 2007/0126313 A1 | 6/2007 | Ueno et al. |
| 2008/0303377 A1 | 12/2008 | Oka et al. |
| 2009/0236944 A1 | 9/2009 | Shibata et al. |
| 2009/0302715 A1 | 12/2009 | Shibata et al. |
| 2011/0121690 A1 | 5/2011 | Shibata et al. |
| 2011/0175488 A1 | 7/2011 | Shibata et al. |
| 2013/0009519 A1 | 1/2013 | Shibata et al. |
| 2013/0038176 A1 | 2/2013 | Horikiri et al. |
| 2013/0106242 A1 | 5/2013 | Shibata et al. |
| 2014/0042875 A1* | 2/2014 | Suenaga ............. H01L 41/1873 310/365 |
| 2014/0339961 A1 | 11/2014 | Maejima et al. |
| 2015/0229290 A1 | 8/2015 | Suenaga et al. |
| 2016/0172574 A1 | 6/2016 | Ikeuchi et al. |

FOREIGN PATENT DOCUMENTS

| | | |
|---|---|---|
| JP | 2008-159807 A | 7/2008 |
| JP | 2011146623 A | 7/2011 |
| JP | 2011-204887 A | 10/2011 |
| JP | 2013-38322 A | 2/2013 |
| JP | 2013-251355 A | 12/2013 |
| JP | 2014-187094 A | 10/2014 |
| JP | 2014-229902 A | 12/2014 |
| WO | 2015033791 A1 | 3/2017 |

OTHER PUBLICATIONS

Search Report issued in European Patent Application No. 16855387 dated Sep. 19, 2019.
Lee, S. Y., et al, "Effect of Mn substitution on ferroelectric and leakage current characteristics of lead-free (K0.5Na0.5) (MnxNb1-x)03 thin films", Current Applied Physics, Mar. 21, 2011, pp. S266-S269, vol. 11, No. 3, XP028331998.
Kurokawa, F. et al., "Microfabrication of lead-free (K,Na)Nb03, piezoelectric thin films by dry etching", Transducers & Eurosensors XXVII, Jun. 16-20, 2013, pp. 1051-1054, XP032499807.
English translation of Written Opinion for PCT/JP20161080105 previously submitted on Apr. 12, 2018.
Notification of Reasons for Refusal issued in corresponding Japanese Patent Application No. JP2017-211563 dated Jul. 31, 2018, and an English translation dated Aug. 24, 2018.

* cited by examiner

FIG. 8A

| Cu-CONCENTRATION (at%) | TIME FROM IMMERSION TO START OF EROSION IN BHF SOLUTION (MINUTE) |
|---|---|
| 0 | 0.5~1 |
| 0.1 | 1 |
| 0.2 | WITHOUT IMMERSION (AFTER ELAPSE OF 15 MINUTES) |
| 0.25 | WITHOUT IMMERSION (AFTER ELAPSE OF 15 MINUTES) |
| 0.5 | WITHOUT IMMERSION (AFTER ELAPSE OF 60 MINUTES) |
| 0.6 | WITHOUT IMMERSION (AFTER ELAPSE OF 60 MINUTES) |
| 0.7 | WITHOUT IMMERSION (AFTER ELAPSE OF 60 MINUTES) |
| 1.0 | WITHOUT IMMERSION (AFTER ELAPSE OF 120 MINUTES) |

FIG. 8B

| Cu-CONCENTRATION (at%) | VOLTAGE UP TO FLOWING OF LEAKAGE CURRENT OF 500 µA/cm² |
|---|---|
| 0 | 2~4 |
| 0.1 | 5~7 |
| 0.2 | 30~34 |
| 0.25 | WITHOUT LEAKAGE (AT THE TIME OF APPLYING VOLTAGE OF 50 V) |
| 0.5 | WITHOUT LEAKAGE (AT THE TIME OF APPLYING VOLTAGE OF 100 V) |
| 0.6 | WITHOUT LEAKAGE (AT THE TIME OF APPLYING VOLTAGE OF 100 V) |
| 0.7 | WITHOUT LEAKAGE (AT THE TIME OF APPLYING VOLTAGE OF 100 V) |
| 1.0 | WITHOUT LEAKAGE (AT THE TIME OF APPLYING VOLTAGE OF 100 V) |

FIG. 8C

| Cu-CONCENTRATION (at%) | RELATIVE PERMITTIVITY |
|---|---|
| 0 | 270 |
| 0.1 | 310~330 |
| 0.2 | 310~350 |
| 0.25 | 330~370 |
| 0.5 | 710~750 |
| 0.6 | 920 |
| 0.7 | 1580 |
| 1.0 | 1750~1800 |

LAMINATED SUBSTRATE WITH PIEZOELECTRIC THIN FILM, PIEZOELECTRIC THIN FILM ELEMENT AND METHOD FOR MANUFACTURING THIS ELEMENT

TECHNICAL FIELD

The present disclosure relates to laminated substrate with a piezoelectric thin film, a piezoelectric thin film element and a method for manufacturing is element.

DESCRIPTION OF RELATED ART

A piezoelectric compact is utilized widely for a functional electronic component such as a sensor and an actuator. Lead-based materials, in particular, PZT-based ferroelectrics represented by a composition formula of Pb $(Zr_{1-x}Ti_x) O_3$ are used widely for a material of the piezoelectric compact. The PZT-based piezoelectric compact can be manufactured using a sintering method for sintering multiple kinds of oxides.

Recently, there is a high request for a thinner film and a higher performance of the piezoelectric compact. However, in the piezoelectric compact manufactured using the sintering method, a deterioration of property is remarkable as a thickness of the piezoelectric compact is closer to a size of a crystal grain constituting the piezoelectric compact, for example 10 µm due to the thinner film of the piezoelectric compact. Therefore, a new method applying a thin film technique such as a sputtering method has been researched as a method instead of the sintering method.

Further, the PZT-based piezoelectric compact contains lead of about 60 to 70 wt %. This is undesirable in terms of pollution prevention, etc. Currently, various piezoelectric materials not containing lead have been researched. These materials include alkali niobium oxide (potassium sodium niobate, also referred to as KNN hereafter) represented by a composition formula of $(K_{1-x}Na_x) NbO_3$ and having a perovskite structure (see patent documents 1, 2 for example). Since KNN has a relatively excellent piezoelectric property, KNN is expected as a major candidate of the piezoelectric material not containing lead.

PRIOR ART DOCUMENT

Patent Document

Patent document 1: Japanese Patent Laid Open Publication No. 2007-184513

Patent document 2: Japanese Patent Laid Open Publication No. 2008-159807

SUMMARY

Problem to be Solved by Disclosure

An object of the present disclosure is to improve a film property of the piezoelectric thin film formed using alkali niobium oxide.

Means for Solving the Problem

According to an aspect of the present disclosure, there is provided a laminated substrate with a piezoelectric thin film, including:

a substrate;
an electrode film formed on the substrate; and
a piezoelectric thin film formed on the electrode film,
wherein the piezoelectric thin film is made of an alkali niobium oxide represented by a composition formula of $(K_{1-x}Na_x) NbO_3$ (0<x<1), having a perovskite structure, and oriented preferentially in (001) plane direction, and
contains a metallic element selected from a group consisting of Mn and Cu at a concentration of 0.2 at % or more and 0.6 at % or less.

According to another aspect of the present disclosure, there is provided a laminated substrate with a piezoelectric thin film, including:

a substrate;
an electrode film formed on the substrate; and
a piezoelectric thin film formed on the electrode film,
wherein the piezoelectric thin film is made of an alkali niobium oxide represented by a composition formula of $(K_{1-x}Na_x) NbO_3$ (0<x<1), having a perovskite structure, and oriented preferentially in (001) plane direction,
has an etching rate of 0.005 µm/hr or less, when etching is performed using a fluorine-based etching solution containing hydrogen fluoride at a concentration of 4.32 mol/L and ammonium fluoride at a concentration of 10.67 mol/L respectively, and
has a relative permittivity of 300 or more and 1000 or less, when being measured under a condition of a frequency of 1 kHz.

According to further another aspect of the present disclosure, there is provided a piezoelectric thin film element, including:

a lower electrode film;
a piezoelectric thin film formed on the lower electrode film; and
an upper electrode film formed on the piezoelectric thin film,
wherein the piezoelectric thin film is made of an alkali niobium oxide represented by a composition formula of $(K_{1-x}Na_x) NbO_3$ (0<x<1), having a perovskite structure, and oriented preferentially in (001) plane direction, and
contains a metallic element selected from a group consisting of Mn and Cu at a concentration of 0.2 at % or more and 0.6 at % or less.

According to further another aspect of the present disclosure, there is provided a method for manufacturing a piezoelectric thin film element, including:

preparing a laminated substrate with a piezoelectric thin film which is made of an alkali niobium oxide represented by a composition formula of $(K_{1-x}Na_x) NbO_3$ (0<x<1), having a perovskite structure, and oriented preferentially in (001) plane direction, and which contains a metallic element selected from a group consisting of Mn and Cu at a concentration of 0.2 at % or more and 0.6 at % or less; and etching at least a part of the laminated substrate other than the piezoelectric thin film by supplying a fluorine-based etching solution to the laminated substrate, in a state that at least a part of the piezoelectric thin film is exposed.

According to further another aspect of the present disclosure, there is provided a method for manufacturing a piezoelectric thin film element, including:

preparing a laminated substrate with a piezoelectric thin film which is made of an alkali niobium oxide represented by a composition formula of $(K_{1-x}Na_x) NbO_3$ (0<x<1), having a perovskite structure, and oriented preferentially in (001) plane direction, and which contains a metallic element selected from a group consisting of Mn and Cu at a concentration of 0.2 at % or more and 0.6 at % or less; and controlling an end-point of etching of an insulating film formed on the piezoelectric thin film by making the piezoelectric thin film act as etching stopper, when a surface of the piezoelectric thin film is exposed by etching a part of the insulating film by supplying a fluorine-based etching solution to the insulating film.

Advantage of the Disclosure

According to the present disclosure, the film property of the piezoelectric thin film formed using alkali niobium oxide can be improved.

BRIEF DESCRIPTION OF THE DRAWINGS

FIG. 8A is a view showing an evaluation result regarding an etching resistance of the piezoelectric thin film, FIG. 8B is a view showing an evaluation result regarding an insulation property of the piezoelectric thin film, and FIG. 8C is a view showing an evaluation result regarding a relative permittivity of the piezoelectric thin film.

DETAILED DESCRIPTION OF THE DISCLOSURE

First Embodiment

Figure 1:
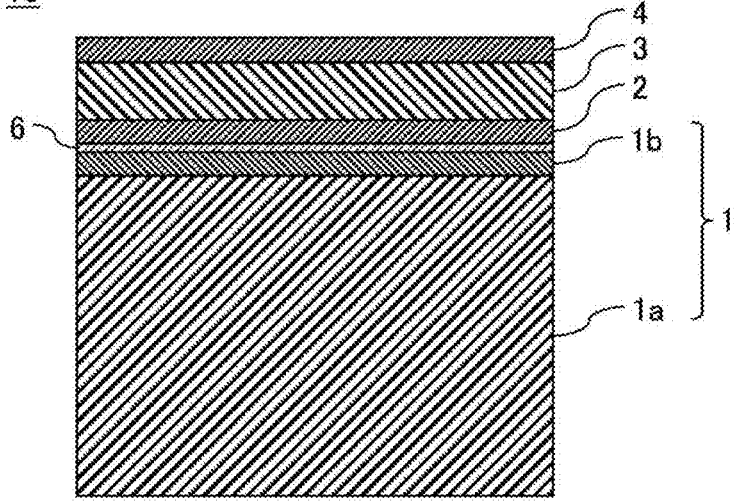
FIG. 1 is a view showing a cross-sectional structure of a laminated substrate according to an embodiment of the present disclosure.

An embodiment of the present disclosure will be described hereafter.
(1) A Constitution of a Laminated Substrate As shown in FIG. 1, a laminated substrate 10 of this embodiment is constituted as a laminated body including a substrate 1, a lower electrode film 2 formed on the substrate 1, a piezoelectric thin film 3 formed on the lower electrode film 2, and an upper electrode film 4 formed on the piezoelectric thin film 3.

As the substrate 1, a single-crystal silicon (Si) substrate $1a$ on which a surface oxide film ($SiO_2$-film) $1b$ such as a thermal oxide film or a CVD (Chemical Vapor Deposition) oxide film is formed, namely, a Si-substrate with the surface oxide film, can be used preferably. Further, a Si-substrate $1a$ a in which Si-(100) plane or Si-(111) plane, etc., is exposed on a surface thereof, namely, a Si-substrate not having the surface oxide film can also be used as the substrate 1. Further, an SOI (Silicon On Insulator) substrate, a quartz glass ($SiO_2$) substrate, a gallium arsenide (GaAs) substrate, a sapphire ($Al_2O_3$) substrate, a metal substrate made of stainless steel or the like can also be used as the substrate 1. The single-crystal Si-substrate $1a$ has a thickness of 300 to 1000 μm for example, and the surface oxide film $1b$ has a thickness of 100 to 300 nm for example.

The lower electrode film 2 can be formed using platinum (Pt) for example. The lower electrode film 2 is a single-crystal film or a poly-crystal film (they are also referred to as a Pt-film hereafter). Preferably, crystal constituting the Pt-film is oriented preferentially in (111) plane direction with respect to a surface of the substrate 1. Namely, it is preferable that a surface of the Pt-film (a surface which is a base of the piezoelectric thin film 3) is mainly constituted of Pt-(111) plane. The Pt-film can be formed using a method such as a sputtering method, or an evaporation method. In addition to Pt, the lower electrode film 2 may also be formed using various metals such as gold (Au), ruthenium (Ru), or iridium (Ir), an alloy mainly composed of the abovementioned various metals, or a metallic oxide such as strontium ruthenate ($SrRuO_3$) or lanthanum nickelate ($LaNiO_3$), etc. An adhesion layer 6 mainly composed of titanium (Ti), tantalum (Ta), titanium oxide ($TiO_2$), or nickel (Ni), etc., for example is provided between the substrate 1 and the lower electrode film 2 in order to enhance an adhesion between them. The adhesion layer 6 can be formed using a method such as a sputtering method, or an evaporation method. The lower electrode film 2 has a thickness of 100 to 300 nm for example, and the adhesion layer 6 has a thickness of 1 to 20 nm for example.

Figure 3:
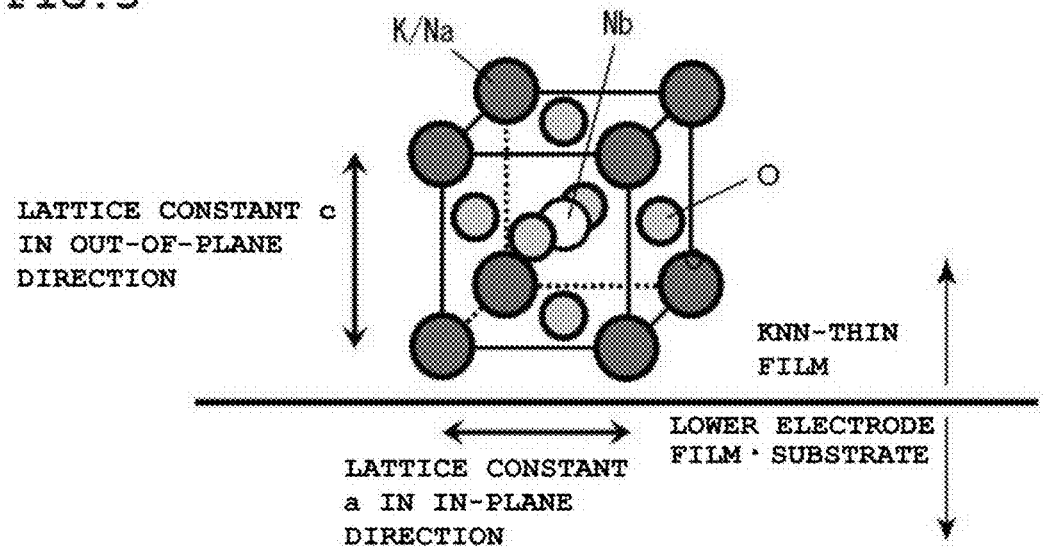
FIG. 3 is a schematic constitution view showing a crystal structure of potassium sodium niobate.

The piezoelectric thin film 3 can be formed using alkali niobium oxide which contains potassium (K), sodium (Na), and niobium (Nb), and which is represented by a composition formula of $(K_{1-x}Na_x)NbO_3$. Namely, the piezoelectric thin film 3 can be formed using potassium sodium niobate (KNN). An coefficient x [=Na/(K+Na)] in the abovementioned composition formula is set to a value in a range of $0<x<1$, preferably $0.4 \leq x \leq 0.7$. The piezoelectric thin film 3 is a film made of poly-crystal of KNN (also referred to as a KNN-thin film hereafter). A crystal structure of KNN is a perovskite structure as shown in FIG. 3. Preferably, crystal constituting the KNN-thin film is oriented preferentially in (001) plane direction with respect to the surface of the substrate 1. Namely, it is preferable that a surface of the KNN-thin film (a surface which is a base of the upper electrode film 4) is mainly constituted of KNN-(001) plane. By forming the KNN-thin film directly on the Pt-film oriented preferentially in (111) plane direction with respect to the surface of the substrate 1, crystal constituting the KNN-thin film can be oriented preferentially in (001) plane direction with respect to the surface of the substrate 1. For example, 80% or more crystal of a crystal group constituting the KNN-thin film can be oriented in (001) plane direction with respect to the surface of the substrate 1, and thereby 80% or more region of the surface of the KNN-thin film can be KNN-(001) plane. The KNN-thin film can be formed using a method such as a sputtering method, a PLD (Pulsed Laser Deposition) method, or a sol-gel method. The piezoelectric thin film 3 has a thickness of 1 to 5 μm for example.

Preferably, the piezoelectric thin film 3 contains a metallic element selected from a group consisting of manganese (Mn) and copper (Cu) at a concentration in a range of 0.2 at % or more and 0.6 at % or less. This point will be described later.

The upper electrode film 4 can be formed using various metals such as Pt, Au, aluminum (Al), or Cu, or an alloy of these various metals, for example. The upper electrode film 4 can be formed using a method such as a sputtering method, an evaporation method, a plating method, or a metal paste method. The upper electrode film 4 does not greatly affect the crystal structure of the piezoelectric thin film 3 unlike the lower electrode film 2. Therefore, a material and a crystal structure of the upper electrode film 4, and a method for forming the upper electrode film 4 are not particularly limited. An adhesion layer mainly composed of Ti, Ta, $TiO_2$, Ni, etc., for example may be provided between the piezoelectric thin film 3 and the upper electrode film 4 in order to enhance an adhesion between them. The upper electrode film 4 has a thickness of 100 to 1000 nm for example, and the adhesion layer has a thickness of 1 to 20 nm in a case of providing the adhesion layer.

(2) A Constitution of a Piezoelectric Thin Film Device

Figure 4:
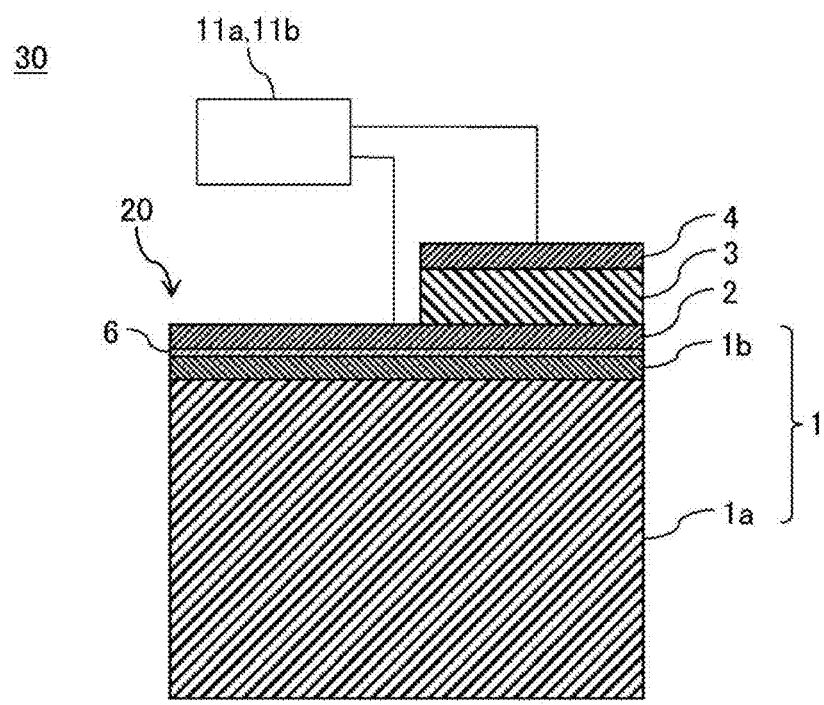
FIG. 4 is a schematic constitution view of a piezoelectric thin film device according to an embodiment of the present disclosure.

FIG. 4 shows a schematic constitution view of a piezoelectric thin film device 30 of this embodiment. The piezoelectric thin film device 30 is constituted including at least a piezoelectric thin film element 20 obtained by forming the abovementioned laminated substrate 10 into a prescribed shape, and a voltage detection means 11a or a voltage application means 11b connected to the piezoelectric thin film element 20.

By connecting the voltage detection means 11a between the lower electrode film 2 and the upper electrode film 4 of the piezoelectric thin film element 20, the piezoelectric thin film device 30 can function as a sensor. When the piezoelectric thin film 3 is deformed according to a variation of some physical quantity, a voltage occurs between the lower electrode film 2 and the upper electrode film 4 due to the deformation. By detecting this voltage using the voltage detection means 11a, the physical quantity applied to the piezoelectric thin film 3 can be measured. In this case, the piezoelectric thin film device 30 can be applied to an angular velocity sensor, an ultrasonic sensor, a pressure sensor, and an acceleration sensor, etc., for example.

By connecting the voltage application means 11b between the lower electrode film 2 and the upper electrode film 4 of the piezoelectric thin film element 20, the piezoelectric thin film device 30 can function as an actuator. By applying a voltage between the lower electrode film 2 and the upper electrode film 4 using the voltage application means 11b, the piezoelectric thin film 3 can be deformed. Various members connected to the piezoelectric thin film device 30 can be actuated due to the abovementioned deformation movement. In this case, the piezoelectric thin film device 30 can be applied to a head for an inkjet printer, a MEMS mirror for a scanner, and a vibrator for an ultrasonic generator, etc., for example.

(3) Addition of Mn, Cu into the Piezoelectric Thin Film

As described above, the piezoelectric thin film 3 of this embodiment contains the metallic element selected from the group consisting of Mn and Cu at the concentration in a range of 0.2 at % or more and 0.6 at % or less. An effect obtained thereby will be described hereafter.

(a) By adding Mn or Cu into the piezoelectric thin film 3 at the concentration in the abovementioned range, an insulation property (a leakage resistance) of the piezoelectric thin film 3 can be improved. For example, by setting a Cu-concentration in the piezoelectric thin film 3 to 0.2 at % or more and 0.6 at % or less, a leakage current density at the time of applying an electric field of $25 \times 10^6$ V/m to the piezoelectric thin film 3 in a thickness direction, can be 500 $\mu A/cm^2$ or less, preferably 300 $\mu A/cm^2$ or less. Further, for example, by setting a Mn-concentration in the piezoelectric thin film 3 to 0.2 at % or more and 0.6 at % or less as well, it is possible to obtain the same insulation property as a case of setting the Cu-concentration in the piezoelectric thin film 3 to the abovementioned range. By improving the insulation property of the piezoelectric thin film 3, it is possible to enhance a performance of the piezoelectric thin film device 30 such as the sensor or the actuator manufactured by processing the abovementioned laminated substrate 10.

(b) By adding Cu into the piezoelectric thin film 3 at the concentration in the abovementioned range, a resistance to a fluorine-based etching solution, namely, an etching resistance can be improved, in addition to the abovementioned insulation property. For example, by setting the Cu-concentration in the piezoelectric thin film 3 to 0.2 at % or more and 0.6 at % or less, an etching rate of the piezoelectric thin film 3 can be 0.005 $\mu m/hr$ or less, when the piezoelectric thin film 3 is immersed in a buffered hydrofluoric acid (BHF) solution containing hydrogen fluoride (HF) at a concentration of 4.32 mol/L and ammonium fluoride ($NH_4F$) at a concentration of 10.67 mol/L. It is found by the present inventors that etching of the piezoelectric thin film 3 does not progress even after elapse of 60 minutes, when the BHF solution is supplied to the piezoelectric thin film 3 under the abovementioned condition.

By improving the etching resistance of the piezoelectric thin film 3, for example the following merit can be obtained.

Figure 5A:
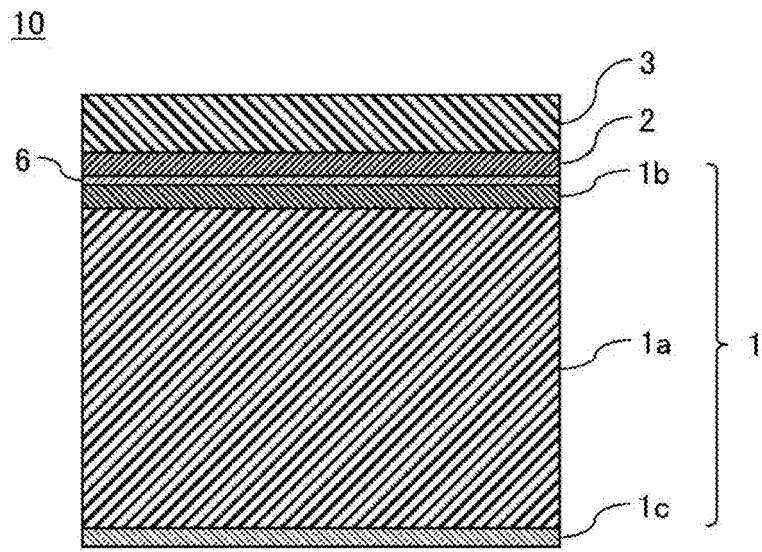
FIG. 5A and FIG. 5B are views showing one of manufacturing steps of a piezoelectric thin film element according to an embodiment of the present disclosure.
Figure 5B:
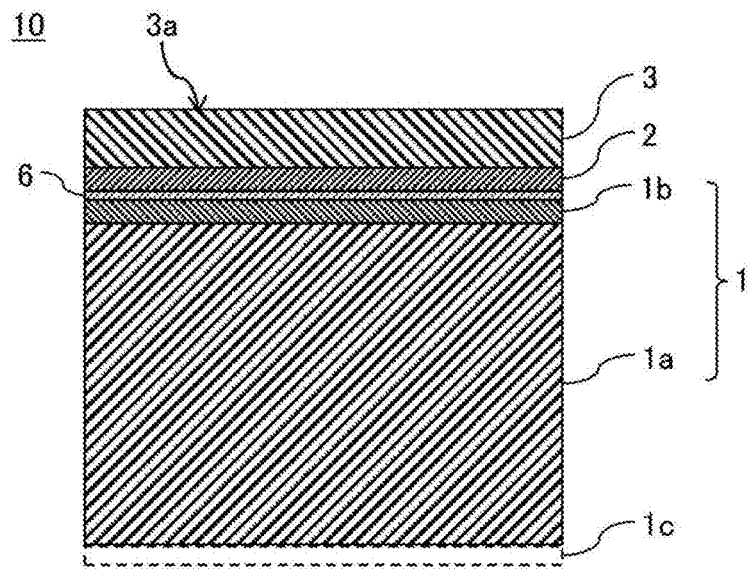

For example, as shown in FIG. 5A, explanation will be given for a processing after preparing the substrate 1 with surface oxide films 1b, 1c respectively formed on front and back surfaces of the single-crystal Si-substrate 1a, and manufacturing the laminated substrate 10 by forming the adhesion layer 6, the lower electrode film 2, and the piezoelectric thin film 3 in this order on the surface oxide film 1b on the front surface side. In this case, as shown in FIG. 5B, there is a case that an etching is performed to the abovementioned surface electrode film 1c on the back surface side using the BHF solution, etc. By enhancing the etching resistance of the piezoelectric thin film 3 as described above, it is not necessary to form a protect film for protecting an exposed surface 3a of the piezoelectric thin film 3 when performing the etching. Therefore, a process can be simplified.

Figure 6A:
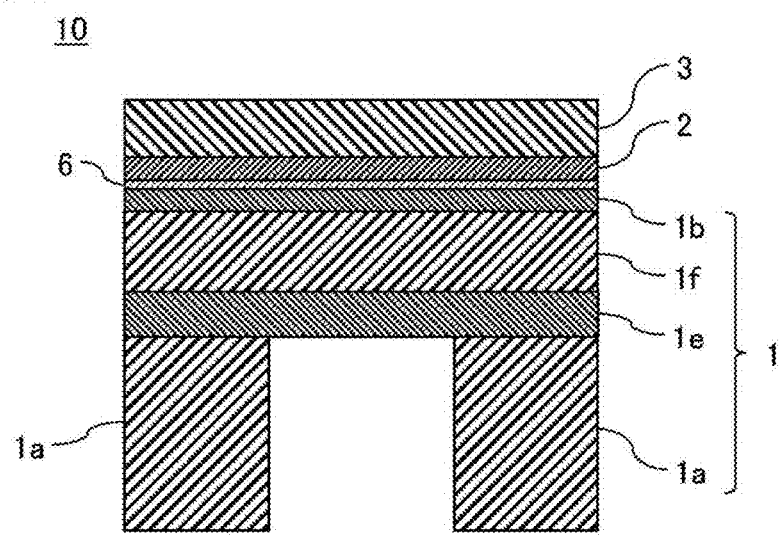
FIG. 6A and FIG. 6B are views showing one of manufacturing steps of the piezoelectric thin film element according to an embodiment of the present disclosure.
Figure 6B:
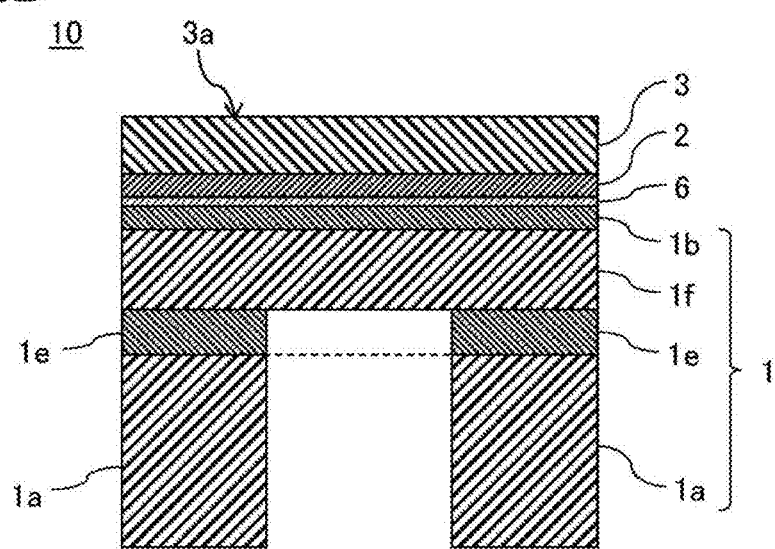

Further, for example, as shown in FIG. 6A, explanation will be given for a processing after preparing the substrate 1 with the surface oxide film 1b formed on a surface of a SOI substrate which is formed by laminating a single-crystal Si-substrate 1a, a BOX layer (a $SiO_2$-layer) 1e, and a Si-layer 1f in this order, and manufacturing the laminated substrate 10 by forming the adhesion layer 6, the lower electrode film 2, and the piezoelectric thin film 3 in this order on the surface oxide film 1b, and then removing a part of the single-crystal Si-substrate 1a by Deep-RIE or wet etching. In this case, as shown in FIG. 6B, there is a case that a processing of removing a part of the BOX layer 1e remaining on a back surface side of the Si-layer 1f is performed using the BHF solution, etc. By enhancing the etching resistance of the piezoelectric thin film 3 as described above, it is not necessary to form the protect film for protecting the exposed surface 3a of the piezoelectric thin film 3 when performing the processing of removing as well. Therefore, the process can be simplified.

Figure 7A:
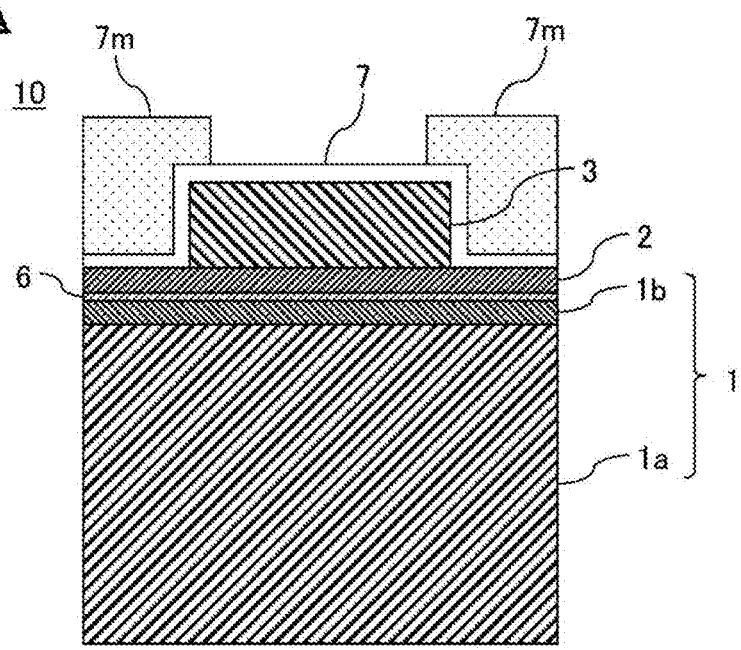
FIG. 7A and FIG. 7B are views showing one of manufacturing steps of the piezoelectric thin film element according to an embodiment of the present disclosure.
Figure 7B:
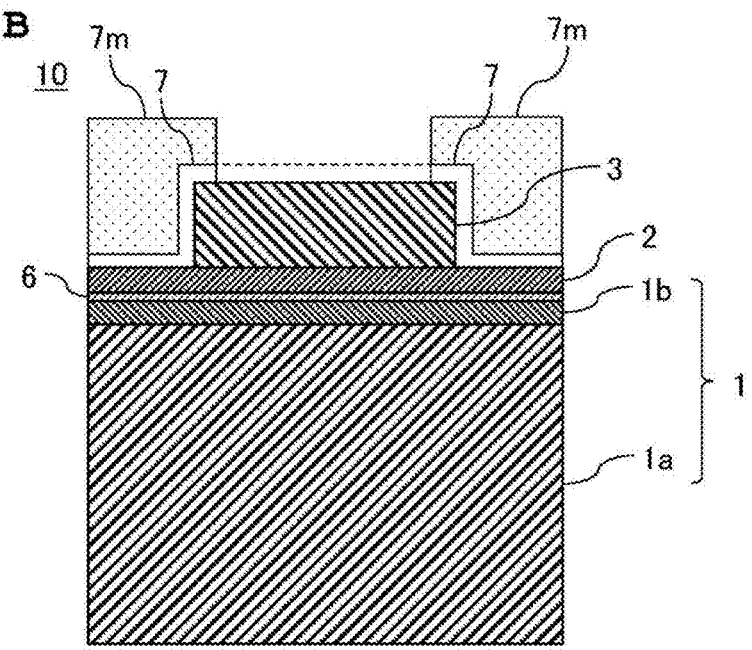

Further, for example, as shown in FIG. 7A, explanation will be given for a processing after forming an insulating film (a $SiO_2$-film) 7 and an etching mask 7m in this order on the piezoelectric thin film 3 after patterning. In this case, as shown in FIG. 7B, there is a case that etching is performed to a part of the insulating film 7 using the BHF solution, etc., in order to expose a region for forming the upper electrode film 4. By enhancing the etching resistance of the piezoelectric thin film 3 which is a base of the insulating film 7 as described above, the piezoelectric thin film 3 can act as etching stopper when performing the etching. Therefore, an end-point of etching of the insulating film 7 can be controlled accurately. Further, the BHF solution whose etching force is stronger than that of an etching gas such as hydrogen fluoride (HF) gas, can be used as an etchant. Therefore, an efficiency of etching can also be enhanced. Further, an etching damage of the piezoelectric thin film 3 caused by etching can be suppressed, even when performing wet etching using the BHF solution, etc.

There is a property that the abovementioned effect of improving the etching resistance can be hardly obtained when adding Mn into the piezoelectric thin film 3, although it can be particularly remarkably obtained when adding Cu into the piezoelectric thin film 3. By utilizing the abovementioned property, a fine-adjustment of the etching resistance of the piezoelectric thin film 3 can also be appropriately performed while improving the insulation property of the piezoelectric thin film 3. For example, by adding both Mn and Cu into the piezoelectric thin film 3 at the concentration in the abovementioned range and making a ratio (Cu/(Mn+Cu)) of the Cu-concentration to a total concentration of Mn and Cu approximated to 1, it is possible to control so as to enhance the etching resistance of the piezoelectric thin film 3 while enhancing the insulation property thereof as described above. Further, for example, by making the abovementioned ratio (Cu/(Mn+Cu)) approximated to 0, it is possible to control so as to suppress appropriately an increase of the etching resistance of the piezoelectric thin film 3 while enhancing the insulation property thereof as described above.

(c) By adding Mn or Cu into the piezoelectric thin film 3 at the concentration in the abovementioned range, it is possible to make a relative permittivity of the piezoelectric thin film 3 suitable for applying to the sensor, the actuator, etc. For example, by setting the Cu-concentration in the piezoelectric thin film 3 to 0.2 at % or more and 0.6 at % or less, the relative permittivity of the piezoelectric thin film 3 can be 1000 or less when being measured under a condition of a frequency of 1 kHz, ±1 V. Further, for example, by setting the Mn-concentration in the piezoelectric thin film 3 to 0.2 at % or more and 0.6 at % or less as well, the relative permittivity of the piezoelectric thin film 3 can be 1000 or less.

(d) As described above, by adding Mn or Cu into the piezoelectric thin film 3 at the concentration in the abovementioned range, a film property of the piezoelectric thin film 3 can be improved. Namely, the insulation property of the piezoelectric thin film 3 can be enhanced, and the relative permittivity of the piezoelectric thin film 3 can be a proper value. Further, by adding Cu into the piezoelectric thin film 3 at the concentration in the abovementioned range, the etching resistance of the piezoelectric thin film 3 can also be enhanced, in addition to the abovementioned effect. Further, by adding both Mn and Cu into the piezoelectric thin film 3 at the concentration in the abovementioned range, a fine-adjustment of the etching resistance of the piezoelectric thin film 3 can also be appropriately performed while obtaining the abovementioned effect.

In order to simultaneously obtain the abovementioned effect in a good balance, it is necessary to set the concentration of Mn or Cu in the piezoelectric thin film 3 to 0.2 at % or more and 0.6 at % or less. As described later, when the total concentration of Mn and Cu in the piezoelectric thin film 3 is less than 0.2 at %, the abovementioned effect regarding the insulation property cannot be obtained in some cases. Further, when the Cu-concentration in the piezoelectric thin film 3 is less than 0.2 at %, the abovementioned effect regarding the etching resistance cannot be obtained in some cases. Further, when the total concentration of Mn and Cu in the piezoelectric thin film 3 is more than 0.6 at %, the relative permittivity of the piezoelectric thin film 3 becomes excessive, thereby causing a deterioration of a sensitivity when the piezoelectric thin film 3 is applied to the sensor, or causing an increase of a power consumption when it is applied to the actuator, in some cases. One reason can be considered as follows: it is difficult to orient crystal constituting the piezoelectric thin film 3 preferentially in (001) plane direction with respect to the surface of the substrate 1, with the increase of an addition amount of Mn or Cu.

(4) Modified Examples

This embodiment is not limited to the abovementioned embodiment, and can be modified as the following modified examples.

For example, the concentration of Mn or Cu in the piezoelectric thin film 3 may be set to 0.2 at % or more and 0.25 at % or less. In this case, the relative permittivity of the piezoelectric thin film 3 can be decreased in the abovementioned range while obtaining the abovementioned effects regarding the insulation property and the etching resistance. For example, the relative permittivity of the piezoelectric thin film 3 measured under a condition of a frequency of 1 kHz, ±1 V, can be in a range of 300 to 400. The laminated substrate 10 thus constituted can be particularly preferably applied to a high sensitive sensor, etc., which is required to have a low permittivity.

Further, for example, the concentration of Mn or Cu in the piezoelectric thin film 3 may be set to 0.5 at % or more and 0.6 at % or less. In this case, the insulation property of the piezoelectric thin film 3 can be further enhanced while obtaining the abovementioned effects regarding the insulation property and the etching resistance. For example, the leakage current density at the time of applying an electric field of $25 \times 10^6$ V/m to the piezoelectric thin film 3 in the thickness direction, can be 500 $\mu A/cm^2$ or less. The laminated substrate 10 thus constituted can be particularly preferably applied to an actuator, etc., which is required to have a high withstanding pressure.

Further, for example, the concentration of Cu in the piezoelectric thin film 3 may be set to 0.4 at % or more and 0.6 at % or less. In this case, the etching resistance of the piezoelectric thin film 3 can be further enhanced while obtaining the abovementioned effects regarding the insulation property and the relative permittivity. For example, the etching rate of the piezoelectric thin film 3 can be 0.005 $\mu$m/hr or less, when the piezoelectric thin film 3 is immersed in the BHF solution having the abovementioned concentration.

Second Embodiment

A ratio (c/a) of a lattice constant c in an out-of-plane direction with respect to a lattice constant a in an in-plane direction of crystal constituting the piezoelectric thin film 3, namely alkali niobium oxide, may be further controlled as follows, while adding Mn or Cu into the piezoelectric thin film 3 similarly to the first embodiment.

For example, a lattice constant ratio may be controlled so that the ratio of the lattice constant c in the out-of-plane direction with respect to the lattice constant a in the in-plane direction of crystal constituting the piezoelectric thin film 3 is set in a range of $0.98 \leq c/a \leq 1.01$. In this case as well, the same effect as the first embodiment can be obtained. Further, an absolute value of a piezoelectric constant of the piezoelectric thin film 3 satisfies $|d_{31}| \geq 90$ pm/V, and thereby a piezoelectric property can be improved.

When the piezoelectric thin film 3 has a plurality of layers represented by a composition formula of $(K_{1-x}Na_x)NbO_3$ (0<x<1), the lattice constant ratio may be controlled so that the ratio of the lattice constant c in the out-of-plane direction with respect to the lattice constant a in the in-plane direction of crystal constituting at least a thickest layer of the plurality of layers is in a range of $0.98 \leq c/a \leq 1.01$. In this case as well, the same effect as the first embodiment can be obtained. Further, the absolute value of the piezoelectric constant of the piezoelectric thin film 3 satisfies $|d_{31}| \geq 90$ pm/V, and thereby the piezoelectric property can be improved.

Further, for example, when a tensile stress occurs in the piezoelectric thin film 3, the lattice constant ratio may be controlled so that the ratio of the lattice constant c in the out-of-plane direction with respect to the lattice constant a in the in-plane direction of crystal constituting the piezoelectric thin film 3 is in a range of $0.980 \leq c/a \leq 0.993$. In this case as well, the same effect as the first embodiment can be obtained. Further, the absolute value of the piezoelectric constant of the piezoelectric thin film 3 satisfies $|d_{31}| \geq 90$ pm/V, and thereby the piezoelectric property can be improved. In this case, it is preferable to form the piezoelectric thin film 3 on a stress relaxation layer made of crystal whose lattice constant is smaller than that of crystal constituting the piezoelectric thin film 3.

Further, for example, when a compressive stress occurs in the piezoelectric thin film 3, the lattice constant ratio may be controlled so that the ratio of the lattice constant c in the out-of-plane direction with respect to the lattice constant a in the in-plane direction of crystal constituting the piezoelectric thin film 3 is in a range of $1.004 \leq c/a \leq 1.010$. In this case, it is preferable to form the piezoelectric thin film 3 on a stress relaxation layer made of crystal whose lattice constant is larger than that of crystal constituting the piezoelectric thin film 3.

The abovementioned c/a-ratio can be adjusted by controlling a partial pressure of $H_2O$ existing in a mixed atmosphere of argon (Ar) gas and oxygen ($O_2$) gas during sputtering film formation. $Ar/O_2$-mixed gas is used as an atmosphere gas during sputtering film formation. However, water existing in a chamber is sometimes mixed in the atmosphere gas although its content is very small. The c/a-ratio of the KNN-thin film greatly depends on an orientation state in (001) plane direction of the KNN-thin film. The c/a-ratio tends to increase in a case of (001)-high orientation, and the c/a-ratio tends to decrease in a case of (001)-low orientation. This (001)-orientation state of the KNN-thin film greatly depends on the partial pressure of $H_2O$ contained in the atmosphere gas during sputtering film formation. The (001)-orientation state tends to be (001)-low orientation when $H_2O$-partial pressure is high, and tends to be (001)-high orientation when $H_2O$-partial pressure is low. Namely, the c/a-ratio of the KNN-thin film can be controlled by strictly controlling $H_2O$-partial pressure in the atmosphere gas.

Third Embodiment

A composition ratio of a substance constituting the piezoelectric thin film 3, namely alkali niobium oxide, may be controlled as follows, while adding Mn or Cu into the piezoelectric thin film 3 similarly to the first embodiment.

For example, the piezoelectric thin film 3 may be formed using alkali niobium oxide represented by a composition formula of $(K_{1-x}Na_x)_yNbO_3$ satisfying $0.4 \leq x \leq 0.7$ and $0.7 \leq y \leq 0.94$, and having a perovskite structure. In this case as well, the same effect as the first embodiment can be obtained. Further, the absolute value of the piezoelectric constant of the piezoelectric thin film 3 satisfies $|d_{31}| \geq 90$ pm/V, and thereby the piezoelectric property can be improved. Further, an insulation resistance of the piezoelectric thin film 3 can also be more surely improved. For example, the leakage current density flowing through the piezoelectric thin film 3 at the time of applying an electric field of 50 kV/cm in the thickness direction, can also be 0.1 $\mu A/cm^2$ or less.

Further, for example, the piezoelectric thin film 3 may be formed using alkali niobium oxide represented by a composition formula of $(K_{1-x}Na_x)_yNbO_3$ satisfying $0.4 \leq x \leq 0.7$ and $0.75 \leq y \leq 0.90$, and having the perovskite structure. In this case as well, the same effect as the first embodiment can be obtained. Further, the absolute value of the piezoelectric constant of the piezoelectric thin film 3 satisfies $|d_{31}| \geq 100$ pm/V, and thereby the piezoelectric property can be improved. Further, the insulation resistance of the piezoelectric thin film 3 can also be more surely improved. For example, the leakage current density flowing through the piezoelectric thin film 3 at the time of applying an electric field of 50 kV/cm in the thickness direction, can also be 0.1 $\mu A/cm^2$ or less.

The abovementioned composition ratio can be adjusted by controlling a composition of a target material used during sputtering film formation, for example. The target material can be manufactured by mixing and burning $K_2CO_3$-powder, $Na_2CO_3$-powder, and $Nb_2O_5$-powder, etc., for example. In this case, the composition of the target material can be controlled by adjusting a mixed ratio of $K_2CO_3$-powder, $Na_2CO_3$-powder, and $Nb_2O_5$-powder, etc.

Fourth Embodiment

The composition ratio of the substance constituting the piezoelectric thin film 3 and the c/a-ratio of the lattice constant c in the out-of-plane direction with respect to the lattice constant a in the in-plane direction, may be further controlled respectively as follows, while adding Mn or Cu into the piezoelectric thin film 3 similarly to the first embodiment.

For example, the piezoelectric thin film 3 may be formed using alkali niobium oxide represented by a composition formula of $(K_{1-x}Na_x)_yNbO_3$ satisfying $0.4 \leq x \leq 0.7$ and $0.77 \leq y \leq 0.90$, and having the perovskite structure, and the lattice constant ratio may be controlled so that the ratio of the lattice constant c in the out-of-plane direction with respect to the lattice constant a in the in-plane direction of crystal constituting the piezoelectric thin film 3 is set in a range of $0.98 \leq c/a \leq 1.008$. In this case as well, the same effect as the first embodiment can be obtained. Further, the absolute value of the piezoelectric constant of the piezoelectric thin film 3 satisfies $|d_{31}| \geq 90$ pm/V, and thereby the piezoelectric property can be improved. Further, the insulation resistance of the piezoelectric thin film 3 can be more surely improved. For example, the leakage current density flowing through the piezoelectric thin film 3 at the time of applying an electric field of 50 kV/cm in the thickness direction, can also be 0.1 $\mu A/cm^2$ or less.

When the piezoelectric thin film 3 has a plurality of layers represented by a composition formula of $(K_{1-x}Na_x)NbO_3$ (0<x<1), the lattice constant ratio may be controlled so that the ratio of the lattice constant c in the out-of-plane direction with respect to the lattice constant a in the in-plane direction of crystal constituting at least a thickest layer of the plurality of layers is set in a range of 0.98≤c/a≤1.008. In this case as well, the same effect as the first embodiment can be obtained. Further, the absolute value of the piezoelectric constant of the piezoelectric thin film 3 satisfies $|d_{31}|≥90$ pm/V, and thereby the piezoelectric property can be improved.

The abovementioned c/a-ratio and the composition ratio can be controlled by the method described in the second embodiment and the third embodiment.

Fifth Embodiment

A concentration of carbon (C) or hydrogen (H) in the piezoelectric thin film 3 may be further controlled respectively as follows, while adding Mn or Cu into the piezoelectric thin film 3 similarly to the first embodiment.

For example, a C-concentration in the piezoelectric thin film 3 may be set to $2×10^{19}$ cm$^{-3}$ or less, or a H-concentration therein may be set to $4×10^{19}$ cm$^{-3}$ or less, when being measured using SIMS. In these cases as well, the same effect as the first embodiment can be obtained. Further, the insulation resistance of the piezoelectric thin film 3 can also be more surely improved. For example, the leakage current density flowing through the piezoelectric thin film 3 at the time of applying an electric field of 50 kV/cm in the thickness direction, can also be 0.1 μA/cm$^2$ or less. Further, a dielectric loss tan δ of the piezoelectric thin film 3 can also be 0.1 or less.

Further, for example, the C-concentration in the piezoelectric thin film 3 may be set to $2×10^{19}$ cm$^{-3}$ or less, and the H-concentration therein may be set to $4×10^{19}$ cm$^{-3}$ or less. In this case as well, the same effect as the first embodiment can be obtained. Further, the insulation resistance of the piezoelectric thin film 3 can also be more surely improved. For example, the leakage current density flowing through the piezoelectric thin film 3 at the time of applying an electric field of 50 kV/cm in the thickness direction, can be 0.1 μA/cm$^2$ or less. Further, the dielectric loss tan δ of the piezoelectric thin film 3 can also be 0.1 or less.

It is effective to decrease a C-concentration and a H-concentration in a KNN-sintered compact target used in sputtering, in order to decrease the C-concentration and the H-concentration in the piezoelectric thin film 3. The C-concentration and the H-concentration in the sintered compact target can be more decreased when setting a burning temperature higher for manufacturing the sintered compact target. Further, it is also effective to increase a ratio of $O_2$ in an atmosphere gas, for example in a mixed gas of Ar-gas and $O_2$-gas, when performing sputtering film formation. Further, it is also effective to perform a heat-treatment in an atmospheric air or an oxygen atmosphere after forming the piezoelectric thin film 3.

Sixth Embodiment

Figure 2:
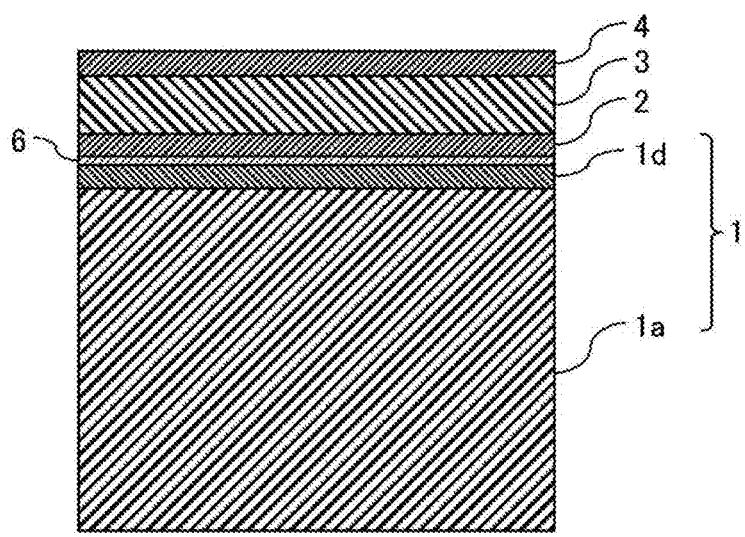
FIG. 2 is a view showing a cross-sectional structure of a laminated substrate according to another embodiment of the present disclosure.

As shown in FIG. 2, a Si-substrate 1a with an insulating film 1d formed on its surface may be used as the substrate 1, the insulating film 1d being made of an insulating material other than $SiO_2$. Even when the adhesion layer 6, the lower electrode film 2, the piezoelectric thin film 3, and the upper electrode film 4 are formed in this order on the insulating film 1d, the same effect as the abovementioned each embodiment, etc., can be obtained by controlling a composition or an crystal orientation of the piezoelectric thin film 3 similarly to the abovementioned each embodiment. The adhesion layer may be provided between the piezoelectric thin film 3 and the upper electrode film 4. This point is same as the first embodiment.

Other Embodiment

As described above, explanation has been given specifically for the embodiments of the present disclosure. However, the present disclosure is not limited thereto, and can be variously modified in a range not departing from the gist of the disclosure. For example, the abovementioned first to sixth embodiments can be combined appropriately and executed.

EXAMPLES

Explanation will be given for an experimental result supporting an effect of the abovementioned embodiment hereafter.

A Si-substrate with a surface of (100) plane direction, a thickness of 610 μm, a diameter of 6 inches, and having a thermal oxide film (a thickness of 200 nm) formed on its surface, was prepared as a substrate. Then, a laminated substrate was manufactured by forming a Ti-layer (thickness of 2 nm) as an adhesion layer, a Pt-film (oriented preferentially in (111) plane direction with respect to a surface of the substrate and having a thickness of 200 nm) as a lower electrode film, and a KNN-thin film (oriented preferentially in (001) plane direction with respect to the surface of the substrate and having a thickness of 2 μm) as a piezoelectric thin film in this order on the thermal oxide film of the substrate. A Cu-concentration (CuO-concentration) in the KNN-thin film was varied in a range of 0 to 1 at %.

All of the Ti-layer, the Pt-film, and the KNN-thin film were formed by an RF magnetron sputtering method. A processing condition for forming the Ti-layer and the Pt-film was set as a substrate temperature: 300° C., a discharge power: 1200 W, a charging gas: Ar, a pressure in Ar atmosphere: 0.3 Pa, and a film formation time: 5 minutes, respectively. A processing condition for forming the KNN-thin film was set as a substrate temperature: 600° C., a discharge power: 2200 W, a charging gas: Ar+$O_2$, a pressure in Ar+$O_2$ mixed atmosphere: 0.3 Pa (Ar/$O_2$ (a ratio of a partial pressure)=25/1), and a film formation rate: 1 μm/hr.

$(K_{1-x}Na_x)_yNbO_3$ sintered compact having a composition of (K+Na)/Nb=0.8 to 1.2 and Na/(K+Na)=0.4 to 0.7, and containing Cu at a concentration of 0.2 at % or more and 0.6 at % or less, was used as a sputtering target material for forming the KNN-thin film into which Cu was added. The target material was formed as follows: $K_2CO_3$-powder, $Na_2CO_3$-powder, $Nb_2O_5$-powder, and CuO-powder were mixed for 24 hours using a ball mill, the mixture was provisionally burned at 850° C. for 10 hours, then pulverized using again the ball mill, and molded under a pressure of 200 MPa, and thereafter burned at 1080° C. The composition of the target material was controlled by adjusting a mixed ratio of $K_2CO_3$-powder, $Na_2CO_3$-powder, $Nb_2O_5$-powder, and CuO-powder, and measured by EDX (energy dispersive X-ray spectrometry) before film formation is performed. In an evaluation as described later, the abovementioned $(K_{1-x}Na_x)_yNbO_3$ sintered compact containing Mn at a concentration of 0.2 at % or more and 0.6 at % or less instead of Cu, was used as a sputtering target material for forming a KNN-thin film into which Mn was added. When the sintered compact was formed, MgO-powder instead of CuO-powder was used in an abovementioned procedure.

An etching resistance, an insulation property, and a relative permittivity of the KNN-thin film included in the laminated substrate were measured respectively. FIG. 8A is a view showing an evaluation result regarding the etching resistance of the KNN-thin film, FIG. 8B is a view showing an evaluation result regarding the insulation property of the KNN-thin film, and FIG. 8C is a view showing an evaluation result regarding the relative permittivity of the KNN-thin film.

(Evaluation Regarding Etching Resistance)

The evaluation of the etching-resistant was performed as follows: the laminated substrate was immersed in a BHF solution in a state that a surface of the KNN-thin film is exposed, and a time from the immersion to start of surface erosion of the KNN-thin film was measured. A HF-concentration in the BHF solution was set to 4.32 mol/L, and a $NH_4F$-concentration therein was set to 10.67 mol/L.

As shown in FIG. 8A, it was confirmed that the surface erosion of the KNN-thin film in which the Cu-concentration was set to 0 at %, was started in less than 1 minute after immersion in the BHF solution. It was confirmed that the surface erosion of the KNN-thin film in which the Cu-concentration was set to 0.1 at %, was started in about 1 minute after immersion although etching of the KNN-thin film was relatively hardly progressed. It was confirmed that the surface erosion of the KNN-thin film in which the Cu-concentration was set to 0.2 at %, could be avoided for at least 15 minutes after immersion. It was confirmed that the surface erosion of the KNN-thin film in which the Cu-concentration was set to 0.5 at %, could be avoided for at least 60 minutes after immersion.

Namely, it was confirmed that the etching resistance of the KNN-thin film could be dramatically enhanced by setting the Cu-concentration in the KNN-thin film to 0.2 at % or more, and the etching resistance of the KNN-thin film could be further enhanced by setting the Cu-concentration in the film to 0.5 at % or more. Further, it was confirmed that the abovementioned effect regarding the etching resistance could be hardly obtained, when Mn instead of Cu was added into the KNN-thin film.

(Evaluation Regarding Insulation Property)

The evaluation of the insulation property was performed as follows: a circular Pt-film with a diameter of 0.5 mm was formed on the KNN-thin film as an upper electrode film so that a voltage could be applied between the lower electrode film and the upper electrode film, and a voltage value was measured up to a leakage current of 500 $\mu A/cm^2$ flowing between these films.

As shown in FIG. 8B, it was confirmed that the leakage current of 500 $\mu A/cm^2$ flowed through the KNN-thin film in which the Cu-concentration was set to 0 at %, by applying the voltage of 2 to 4 V in a film thickness direction. Further, it was confirmed that the leakage current of 500 $\mu A/cm^2$ flowed through the KNN-thin film in which the Cu-concentration was set to 0.1 at %, by applying a voltage of 5 to 7 V in the film thickness direction.

Meanwhile, it was confirmed that a voltage of 30 to 34 V was required to be applied in the film thickness direction for flowing the leakage current of 500 $\mu A/cm^2$ through the KNN-thin film in which the Cu-concentration was set to 0.2 at %. Further, it was confirmed that in the KNN-thin film in which the Cu-concentration was set to 0.25 at %, the leakage current of 500 $\mu A/cm^2$ or more was not observed, and the leakage current was 300 $\mu A/cm^2$ or less at a maximum, even when a voltage of 50 V was applied in the film thickness direction. Further, it was confirmed that in the KNN-thin film in which the Cu-concentration was set to 0.5 at % or more, the leakage current of 500 $\mu A/cm^2$ or more was not observed, even when a voltage of 100 V was applied in the film thickness direction.

Namely, it was confirmed that the insulation property of the KNN-thin film could be dramatically enhanced by setting the Cu-concentration in the KNN-thin film to 0.2 at % or more, and the insulation property of the KNN-thin film could be further enhanced by setting the Cu-concentration in this film to 0.25 at % or more, further 0.5 at % or more. Further, it was confirmed that the abovementioned effect regarding the insulation property could be obtained similarly to a case of adding Cu into the KNN-thin film, even when adding Mn instead of Cu into the KNN-thin film. In this case, a preferred concentration range of a Mn-concentration was the same as the abovementioned Cu-concentration range.

(Evaluation Regarding Relative Permittivity)

The evaluation of the relative permittivity was performed by measuring it by applying an alternating electric field of 1 kHz and ±1 V to the KNN-thin film.

As shown in FIG. 8C, it was confirmed that the KNN-thin film in which the Cu-concentration was set to 0.7 at % or more had the relative permittivity exceeding 1000. Further, it was confirmed that the KNN-thin film in which the Cu-concentration was set to 0.6 at % or less had the relative permittivity of less than 1000. Further, it was confirmed that the KNN-thin film in which the Cu-concentration was set to 0.25 at % or less had the relative permittivity of less than 400.

Namely, it was confirmed that the KNN-thin film had the relative permittivity suitable for applying to a sensor and an actuator by setting the Cu-concentration in the KNN-thin film to 0.6 at % or less, and the KNN-thin film had the relative permittivity suitable for applying to a high sensitivity sensor by setting the Cu-concentration in the film to 0.25 at % or less. Further, it was confirmed that the abovementioned effect regarding the relative permittivity could be obtained similarly to a case of adding Cu into the KNN-thin film, even when adding Mn instead of Cu into the KNN-thin film. In this case, the preferred concentration range of the Mn-concentration was the same as the abovementioned Cu-concentration range.

Preferable Aspects of the Present Disclosure

Preferable aspects of the present disclosure will be supplementarily described hereafter.

(Supplementary Description 1)

According to an aspect of the present disclosure, there is provided a laminated substrate with a piezoelectric thin film, including:

a substrate;

an electrode film formed on the substrate; and a piezoelectric thin film formed on the electrode film, wherein the piezoelectric thin film is made of an alkali niobium oxide represented by a composition formula of $(K_{1-x}Na_x)NbO_3$ (0<x<1), having a perovskite structure, and oriented preferentially in (001) plane direction, and contains a metallic element selected from a group consisting of Mn and Cu at a concentration of 0.2 at % or more and 0.6 at % or less.

(Supplementary Description 2)

Preferably, there is provided the laminated substrate of the supplementary description 1, wherein a concentration of the metallic element in the piezoelectric thin film is 0.2 at % or more and 0.25 at % or less.

(Supplementary Description 3)
Further preferably, there is provided the laminated substrate of the supplementary description 1, wherein a concentration of the metallic element in the piezoelectric thin film is 0.5 at % or more and 0.6 at % or less.

(Supplementary Description 4)
Further preferably, there is provided the laminated substrate of the supplementary description 1, wherein a concentration of the metallic element in the piezoelectric thin film is 0.4 at % or more and 0.6 at % or less.

(Supplementary Description 5)
According to another aspect of the present disclosure, there is provided a laminated substrate with a piezoelectric thin film, including:
a substrate;
an electrode film formed on the substrate; and
a piezoelectric thin film formed on the electrode film,
wherein the piezoelectric thin film is made of an alkali niobium oxide represented by a composition formula of $(K_{1-x}Na_x)NbO_3$ $(0<x<1)$, having a perovskite structure, and oriented preferentially in (001) plane direction,
has an etching rate of 0.005 μm/hr or less, when etching is performed using a fluorine-based etching solution containing hydrogen fluoride at a concentration of 4.32 mol/L and ammonium fluoride at a concentration of 10.67 mol/L respectively,
has a leakage current density of 500 μA/cm$^2$ or less (preferably 300 μA/cm$^2$ or less), at the time of applying an electric field of $25 \times 10^6$ V/m in a thickness direction, and
has a relative permittivity of 300 or more and 1000 or less, when being measured under a condition of a frequency of 1 kHz.

(Supplementary Description 6)
Further preferably, there is provided the laminated substrate of any one of the supplementary descriptions 1 to 5, wherein
a ratio of a lattice constant c in an out-of-plane direction with respect to a lattice constant a in an in-plane direction of crystal (alkali niobium oxide) constituting the piezoelectric film is in a range of $0.98 \leq c/a \leq 1.01$, and
an absolute value of a piezoelectric constant of the piezoelectric thin film satisfies $|d_{31}| \geq 90$ pm/V.

(Supplementary Description 7)
Further preferably, there is provided the laminated substrate of the supplementary description 6, wherein the piezoelectric thin film has a plurality of layers represented by a composition formula of $(K_{1-x}Na_x)NbO_3$ $(0<x<1)$, and
a ratio of a lattice constant c in an out-of-plane direction with respect to a lattice constant a in an in-plane direction of crystal (alkali niobium oxide) constituting at least a thickest layer of the plurality of layers is in a range of $0.98 \leq c/a \leq 1.01$.

(Supplementary Description 8)
Further preferably, there is provided the laminated substrate of the supplementary description 6 or 7, wherein a tensile stress occurs in the piezoelectric thin film, and a ratio of a lattice constant c in an out-of-plane direction with respect to a lattice constant a in an in-plane direction of crystal (alkali niobium oxide) constituting the piezoelectric thin film is in a range of $0.980 \leq c/a \leq 0.993$.

(Supplementary Description 9)
Further preferably, there is provided the laminated substrate of the supplementary description 8, wherein the piezoelectric thin film is formed on a stress relaxation layer made of crystal whose lattice constant is smaller than that of crystal constituting the piezoelectric thin film.

(Supplementary Description 10)
Further preferably, there is provided the laminated substrate of the supplementary description 6 or 7, wherein a compressive stress occurs in the piezoelectric thin film, and a ratio of a lattice constant c in an out-of-plane direction with respect to a lattice constant a in an in-plane direction of crystal (alkali niobium oxide) constituting the piezoelectric thin film is in a range of $1.004 \leq c/a \leq 1.010$.

(Supplementary Description 11)
Further preferably, there is provided the laminated substrate of the supplementary description 10, wherein the piezoelectric thin film is formed on a stress relaxation layer made of crystal whose lattice constant is larger than that of crystal constituting the piezoelectric thin film.

(Supplementary Description 12)
Further preferably, there is provided the laminated substrate of any one of the supplementary descriptions 1 to 5, wherein
the piezoelectric thin film is made of an alkali niobium oxide represented by a composition formula of $(K_{1-x}Na_x)_yNbO_3$ satisfying $0.4 \leq x \leq 0.7$ and $0.7 \leq y \leq 0.94$ and having a perovskite structure, with an absolute value $|d_{31}|$ of a piezoelectric constant being 90 pm/V or more.

(Supplementary Description 13)
Further preferably, there is provided the laminated substrate of any one of the supplementary descriptions 1 to 5, wherein
the piezoelectric thin film is made of an alkali niobium oxide represented by a composition formula of $(K_{1-x}Na_x)_yNbO_3$ satisfying $0.4 \leq x \leq 0.7$ and $0.75 \leq y \leq 0.90$ and having a perovskite structure, with an absolute value $|d_{31}|$ of a piezoelectric constant being 100 pm/V or more.

(Supplementary Description 14)
Preferably, there is provided the laminated substrate of any one of the supplementary descriptions 1 to 5, wherein
the piezoelectric thin film is made of an alkali niobium oxide represented by a composition formula of $(K_{1-x}Na_x)_yNbO_3$ satisfying $0.4 \leq x \leq 0.7$ and $0.77 \leq y \leq 0.90$ and having a perovskite structure, and
a ratio of a lattice constant c in an out-of-plane direction with respect to a lattice constant a in an in-plane direction of crystal (alkali niobium oxide) constituting the piezoelectric thin film is in a range of $0.98 \leq c/a \leq 1.008$.

(Supplementary Description 15)
Preferably, there is provided the laminated substrate of the supplementary description 14, wherein
the piezoelectric thin film has a plurality of layers represented by a composition formula of $(K_{1-x}Na_x)NbO_3$ $(0<x<1)$, and
a ratio of a lattice constant c in an out-of-plane direction with respect to a lattice constant a in an in-plane direction of crystal (alkali niobium oxide) constituting at least a thickest layer of the plurality of layers is in a range of $0.98 \leq c/a \leq 1.008$.

(Supplementary Description 16)
Preferably, there is provided the laminated substrate of any one of the supplementary descriptions 1 to 5, wherein C-concentration is $2 \times 10^{19}$ cm$^{-3}$ or less, or H-concentration is $4 \times 10^{19}$ cm$^{-3}$ or less, in the piezoelectric thin film. More preferably, C-concentration is $2 \times 10^{19}$ cm$^{-3}$ or less, and H-concentration is $4 \times 10^{19}$ cm$^{-3}$ or less, in the piezoelectric thin film.

(Supplementary Description 17)
According to further another aspect of the present disclosure, there is provided a piezoelectric thin film element, including:

a lower electrode film;
a piezoelectric thin film formed on the lower electrode film; and
an upper electrode film formed on the piezoelectric thin film,
wherein the piezoelectric thin film is made of an alkali niobium oxide represented by a composition formula of $(K_{1-x}Na_x)NbO_3$ $(0<x<1)$, having a perovskite structure, and oriented preferentially in (001) plane direction, and
contains a metallic element selected from a group consisting of Mn and Cu at a concentration of 0.2 at % or more and 0.6 at % or less.

(Supplementary Description 18)

According to further another aspect of the present disclosure, there is provided a piezoelectric thin film element, including:
a substrate;
a lower electrode film formed on the substrate;
a piezoelectric thin film formed on the lower electrode film; and
an upper electrode film formed on the piezoelectric thin film,
wherein the piezoelectric thin film is made of an alkali niobium oxide represented by a composition formula of $(K_{1-x}Na_x)NbO_3$ $(0<x<1)$, having a perovskite structure, and oriented preferentially in (001) plane direction, and
contains a metallic element selected from a group consisting of Mn and Cu at a concentration of 0.2 at % or more and 0.6 at % or less.

(Supplementary Description 19)

According to further another aspect of the present disclosure, there is provided a method for manufacturing a piezoelectric thin film element, including:
preparing a laminated substrate with a piezoelectric thin film which is made of an alkali niobium oxide represented by a composition formula of $(K_{1-x}Na_x)NbO_3$ $(0<x<1)$, having a perovskite structure, and oriented preferentially in (001) plane direction, and which contains a metallic element selected from a group consisting of Mn and Cu at a concentration of 0.2 at % or more and 0.6 at % or less; and
etching at least a part of the laminated substrate other than the piezoelectric thin film by supplying a fluorine-based etching solution to the laminated substrate (without providing a protect film for covering an exposed surface of the piezoelectric thin film), in a state that at least a part of the piezoelectric thin film is exposed.

(Supplementary Description 20)

According to further another aspect of the present disclosure, there is provided a method for manufacturing a piezoelectric thin film element, including:
preparing a laminated substrate with a piezoelectric thin film which is made of an alkali niobium oxide represented by a composition formula of $(K_{1-x}Na_x)NbO_3$ $(0<x<1)$, having a perovskite structure, and oriented preferentially in (001) plane direction, and which contains a metallic element selected from a group consisting of Mn and Cu at a concentration of 0.2 at % or more and 0.6 at % or less; and
controlling an end-point of etching of an insulating film formed on the piezoelectric thin film by making the piezoelectric thin film act as etching stopper, when a surface of the piezoelectric thin film is exposed by etching a part of the insulating film by supplying a fluorine-based etching solution to the insulating film.

(Supplementary Description 21)

According to further another aspect of the present disclosure, there is provided a sputtering target material, which is made of a sintered compact represented by a composition formula of $(K_{1-x}Na_x)NbO_3$ $(0<x<1)$, and which contains a metallic element selected from a group consisting of Mn and Cu at a concentration of 0.2 at % or more and 0.6 at % or less.

(Supplementary Description 22)

Preferably, there is provided the sputtering target material of the supplementary description 21, wherein a concentration of the metallic element in the sintered compact is 0.2 at % or more and 0.25 at % or less.

(Supplementary Description 23)

Further preferably, there is provided the sputtering target material of the supplementary description 21, wherein a concentration of the metallic element in the sintered compact is 0.5 at % or more and 0.6 at % or less.

(Supplementary Description 24)

Further preferably, there is provided the sputtering target material of the supplementary description 21, wherein a concentration of the metallic element in the sintered compact is 0.4 at % or more and 0.6 at % or less.

DESCRIPTION OF SIGNS AND NUMERALS

1 Substrate
2 Lower electrode film
3 Piezoelectric thin film
10 Laminated substrate

The invention claimed is:

1. A laminated substrate with a piezoelectric thin film, comprising:
a substrate;
an electrode film formed on the substrate; and
a piezoelectric thin film formed on the electrode film,
wherein the piezoelectric thin film is made of an alkali niobium oxide represented by a composition formula of $(K_{1-x}Na_x)NbO_3$ $(0<x<1)$, having a perovskite structure, and oriented preferentially in (001) plane direction, and
contains a metallic element selected from a group consisting of Mn and Cu at a concentration of 0.2 at % or more and 0.6 at % or less, and
the piezoelectric thin film has a leakage current density of 500 $\mu A/cm^2$ or less at the time of applying an electric field of $25 \times 10^6$ V/m in a thickness direction, and
the piezoelectric thin film has a relative permittivity of 300 or more and 1000 or less when being measured under a condition of a frequency of 1 kHz.

2. The laminated substrate with a piezoelectric thin film according to claim 1, wherein a concentration of the metallic element in the piezoelectric thin film is 0.2 at % or more and 0.25 at % or less.

3. The laminated substrate with a piezoelectric thin film according to claim 1, wherein a concentration of the metallic element in the piezoelectric thin film is 0.5 at % or more and 0.6 at % or less.

4. The laminated substrate with a piezoelectric thin film according to claim 1, wherein a concentration of the metallic element in the piezoelectric thin film is 0.4 at % or more and 0.6 at % or less.

5. A laminated substrate with a piezoelectric thin film, comprising:
a substrate;
an electrode film formed on the substrate; and
a piezoelectric thin film formed on the electrode film,
wherein the piezoelectric thin film is made of an alkali niobium oxide represented by a composition formula of $(K_{1-x}Na_x)NbO_3$ (0<x<1), having a perovskite structure, and oriented preferentially in (001) plane direction, has an etching rate of 0.005 μm/hr or less, when etching is performed using a fluorine-based etching solution containing hydrogen fluoride at a concentration of 4.32 mol/L and ammonium fluoride at a concentration of 10.67 mol/L respectively, has a leakage current density of 500 μA/cm² or less, at the time of applying an electric field of $25 \times 10^6$ V/m in a thickness direction, and has a relative permittivity of 300 or more and 1000 or less, when being measured under a condition of a frequency of 1 kHz.

6. A piezoelectric thin film element, comprising:
a lower electrode film;
a piezoelectric thin film formed on the lower electrode film; and
an upper electrode film formed on the piezoelectric thin film, wherein the piezoelectric thin film is made of an alkali niobium oxide represented by a composition formula of $(K_{i-x}Na_x)NbO3$ (0<x<1), having a perovskite structure, and oriented preferentially in (001) plane direction, and contains a metallic element selected from a group consisting of Mn and Cu at a concentration of 0.2 at % or more and 0.6 at % or less, and the piezoelectric thin film has a leakage current density of 500 μA/cm² or less at the time of applying an electric field of $25 \times 10^6$ V/m in a thickness direction, and the piezoelectric thin film has a relative permittivity of 300 or more and 1000 or less when being measured under a condition of a frequency of 1 kHz.

\* \* \* \* \*

UNITED STATES PATENT AND TRADEMARK OFFICE
CERTIFICATE OF CORRECTION

PATENT NO. : 11,107,971 B2
APPLICATION NO. : 15/767677
DATED : August 31, 2021
INVENTOR(S) : Kenji Shibata et al.

Page 1 of 1

It is certified that error appears in the above-identified patent and that said Letters Patent is hereby corrected as shown below:

In the Specification

Column 3, Line 62, "a in which Si-(100) plane" should read -- in which Si-(100) plane --

Signed and Sealed this
Twenty-ninth Day of March, 2022

Drew Hirshfeld
*Performing the Functions and Duties of the*
*Under Secretary of Commerce for Intellectual Property and*
*Director of the United States Patent and Trademark Office*